(12) United States Patent
U-yen et al.

(10) Patent No.: US 9,383,254 B1
(45) Date of Patent: Jul. 5, 2016

(54) SYMMETRIC ABSORBER-COUPLED FAR-INFRARED MICROWAVE KINETIC INDUCTANCE DETECTOR

(71) Applicant: The United States of America as represented by the Administrator of the National Aeronotics and Space Administration, Washington, DC (US)

(72) Inventors: Kongpop U-yen, Arlington, VA (US); Edward J. Wollack, Clarksville, MD (US); Ari D. Brown, Baltimore, MD (US); Thomas R. Stevenson, Rockville, MD (US); Amil A. Patel, Palo Alto, CA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 14/497,238

(22) Filed: Sep. 25, 2014

(51) Int. Cl.
*G01J 5/02* (2006.01)
*G01J 5/08* (2006.01)
*H01Q 1/38* (2006.01)
*G01J 1/42* (2006.01)
*H01P 7/08* (2006.01)
*H01L 39/10* (2006.01)

(52) U.S. Cl.
CPC . *G01J 1/42* (2013.01); *H01L 39/10* (2013.01); *H01P 7/082* (2013.01)

(58) Field of Classification Search
CPC .............. G01J 5/02; G01J 5/08; H01Q 1/38
See application file for complete search history.

(56) References Cited

U.S. PATENT DOCUMENTS 6,310,346 B1* 10/2001 Boreman ............... G01J 5/08
250/338.1

OTHER PUBLICATIONS

P.K. Day, "Antenna-coupled microwave kinetic inductance detectors," Jan. 4, 2006, Nuclear Instruments and Methods in Physics Research A 559 (2006), pp. 561-563.*

* cited by examiner

*Primary Examiner* — David Porta
*Assistant Examiner* — Faye Boosalis

(57) ABSTRACT

The present invention relates to a symmetric absorber-coupled far-infrared microwave kinetic inductance detector including: a membrane having an absorber disposed thereon in a symmetric cross bar pattern; and a microstrip including a plurality of conductor microstrip lines disposed along all edges of the membrane, and separated from a ground plane by the membrane. The conducting microstrip lines are made from niobium, and the pattern is made from a superconducting material with a transition temperature below niobium, including one of aluminum, titanium nitride, or molybdenum nitride. The pattern is disposed on both a top and a bottom of the membrane, and creates a parallel-plate coupled transmission line on the membrane that acts as a half-wavelength resonator at readout frequencies. The parallel-plate coupled transmission line and the conductor microstrip lines form a stepped impedance resonator. The pattern provides identical power absorption for both horizontal and vertical polarization signals.

16 Claims, 6 Drawing Sheets

SYMMETRIC ABSORBER-COUPLED FAR-INFRARED MICROWAVE KINETIC INDUCTANCE DETECTOR

ORIGIN OF THE INVENTION

The invention described herein was made by employees of the United States Government and may be manufactured and used by or for the Government for Government purposes without the payment of any royalties thereon or therefore.

BACKGROUND OF THE INVENTION

1. Field of the Invention

The present invention relates to an absorber-coupled far-infrared microwave kinetic inductance detector (FIR MKID) array with a symmetric cross pattern which serves dual roles as radiation absorber and superconducting readout. The metal pattern on the inductance detector allows power to be more evenly distributed across the detector area than the prior art, thus, increasing the detector coupling efficiency and sensitivity. Furthermore, the cross absorber pattern allows the output of the detector to readout at more than twice the frequency of a conventional MKID design. Finally, the arrangement of the detector's resonator transmission line minimizes parasitic coupling among the adjacent resonator channels. This arrangement reduces the complexity in resonator calculations and allows more detectors to be frequency multiplexed in a limited microwave frequency readout bandwidth with significantly small crosstalk.

2. Description of the Related Art

A microwave kinetic inductance detector (MKID) is a superconducting photon detector which operates at cryogenic temperatures, typically below 1 degree Kelvin. The MKID is used in high-sensitivity astronomical detection for frequencies ranging from the far-infrared (FIR) to X-rays. The kinetic inductance of the superconducting transmission line forming the MKID is inversely proportional to the density of the Cooper pairs, and thus, the kinetic inductance increases upon photon absorption. When combined with a capacitor, a microwave resonator is formed, in which its resonant frequency changes with the absorption of photons. The resonator-based readout is useful for developing large-format detector arrays, as each kinetic inductance detector can be addressed by a single microwave tone, and many kinetic inductance detectors can be measured using a single broadband microwave channel (i.e., using frequency-divisional multiplexing).

Single-layer uniform co-planar waveguide or parallel coupled transmission lines are commonly used to generate the FIR MKIDs. A microstrip electrical transmission line provides greater confinement and signal control in this detector readout application. Further, planar transmission line structures are less expensive, lighter, and significantly more compact than traditional waveguide technologies.

A conventional microwave kinetic inductance detector (MKID) 10 (see FIG. 1), to which power P is applied, includes a meander or a spiral line resonator pattern 11 of an infrared (IR) absorber 12, disposed on a thin membrane 13 of silicon as a dielectric substrate layer (see FIG. 2 for a cross-sectional view of FIG. 1 along line "A"). The absorber 12 may be made of any superconductor material with a transition temperature lower than niobium, including aluminum, titanium nitride, molybdenum nitride etc.

The microstrip electrical transmission line of the conventional MKID 10 includes a low impedance (Z) conducting strip 14 along two edges thereof, separated from a ground plane 15 by the silicon membrane 13. The conducting strip 14 is a superconductor at FIR frequencies and at microwave frequencies. The microwave component is formed from the microstrip 14 and includes the metal pattern 11 of the FIR absorber 12, which also serves as a superconducting resonator at the readout microwave frequency (i.e., typically between 0.3 and 10 GHz). The parallel-transmission line 11, 12 are at an FIR quarter-wave spacing or distance "d" from a conductor backshort 16.

However, disadvantages of the prior art MKID 10 include: 1) a metal pattern 11 which produces asymmetric power coupling for both horizontal and vertical signals; 2) the uniform transmission line used in the resonator results in a high resonator current confined around the center of the microwave kinetic inductance detector (MKID) 10, thus, limiting the MKID 10 sensitivity, and potentially producing strong crosstalk to the adjacent MKID channels; 3) strong parasitic coupling among resonators which produce uncertainty in the resonance frequency calculation, thus, limiting the minimum frequency spacing among MKID channels for large detector array implementations; and 4) the metal pattern 11 on the membrane 13 results in low microwave operating frequencies, which limits the maximum number of resonator channels that can be readout by a cryogenic amplifier. Accordingly, an FIR MKID 10 that does not have these disadvantages is desired.

SUMMARY OF THE INVENTION

In one embodiment, an absorber coupled FIR MKID of the present invention requires a cross absorber metal pattern and sheet resistance to efficiently absorb power at FIR frequencies. In addition, the absorber behaves as a half-wave resonator at microwave frequencies and can be used in frequency-multiplexed detector readout systems.

In one embodiment, a far-infrared microwave kinetic inductance detector includes: a membrane having an absorber disposed thereon; and a microstrip including a plurality of conductor microstrip lines disposed along all edges of the membrane, and separated from a ground plane by the membrane; wherein the absorber is disposed in a pattern, including a symmetric cross bar pattern, on the membrane.

In one embodiment, the pattern is made from a metallic material as the absorber, and the conducting microstrip lines are made from niobium.

In one embodiment, the metallic material of the pattern is formed from a superconducting material with a transition temperature below niobium, including one of aluminum, titanium nitride, or molybdenum nitride.

In one embodiment, the pattern is disposed on both a top and a bottom of the membrane, and creates a parallel-plate coupled transmission line on the membrane that acts as a half-wavelength resonator at readout frequencies.

In one embodiment, the parallel-plate coupled transmission line and the conductor microstrip lines form a stepped impedance resonator.

In one embodiment, the conductor microstrip lines are disposed at a top and at a bottom of the membrane, and the microstrip lines at the bottom of the membrane are at a far infra-red quarter-wave spacing from a conductor backshort.

In one embodiment, a spacing between any two lines of the pattern on the membrane is set at most ⅕ of a wavelength at a shortest infra-red wavelength to minimize sheet reactance, provide an effective impedance match to that of free space, and minimize diffractive scattering from the metallic material as absorber.

In one embodiment, the pattern provides identical power absorption for both horizontal and vertical polarization signals.

In one embodiment, the pattern on the membrane is divided into four sections.

In one embodiment, two outputs of two of the four sections combine a respective two of the four sections at two points of the conductor microstrip lines to produce the stepped impedance resonator.

In one embodiment, the stepped impedance resonator is coupled to a microstrip feed line via a parallel-plate capacitor which performs as an impedance inverter.

In one embodiment, the detector is utilized at cryogenic temperatures below the transition temperature of absorber metallization of the superconducting material.

In one embodiment, the pattern increases a resonance frequency of the stepped impedance resonator, to increase a channel capacity of the detector when used in a large array configuration.

In one embodiment, the pattern allows power to be more evenly distributed across a physical area of the detector to increase detector sensitivity.

In one embodiment, the parallel-plate coupled transmission line minimizes parasitic coupling among adjacent resonator channels.

In one embodiment, the detector is frequency multiplexed in a limited microwave frequency readout bandwidth with reduced crosstalk.

In one embodiment, detector is used in space applications to detect very low power far infra-red frequency signals that have both horizontal and vertical polarizations.

In one embodiment, the detector is installed in low background optical systems.

In one embodiment, the detector is used in millimeter to sub-millimeter radiation detection.

Thus, herein are outlined some features consistent with the present invention, in order that the detailed description thereof that follows, may be better understood, and in order that the present contribution to the art, may be better appreciated. There are, of course, additional features consistent with the present invention that will be described below and which will form the subject matter of the claims appended hereto.

In this respect, before explaining at least one embodiment consistent with the present invention in detail, it is to be understood that the invention is not limited in its application to the details of construction and to the arrangements of the components set forth in the following description or illustrated in the drawings. Methods and apparatuses consistent with the present invention are capable of other embodiments and of being practiced and carried out in various ways. Also, it is to be understood that the phraseology and terminology employed herein, as well as the abstract included below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the methods and apparatuses consistent with the present invention.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIG. 6 (b) is a graph showing a simulated FIR power absorbed by the cross pattern FIR MKID at two different polarizations, according to one embodiment consistent with the present invention.

DESCRIPTION OF THE INVENTION

The present invention relates to an absorber-coupled, extended far-infrared microwave kinetic inductance detector (FIR MKID) array, with cross absorber pattern, which can couple an FIR signal symmetrically at both horizontal and vertical polarizations. The absorber behaves as a half-wave resonator at microwave frequencies and can be used in frequency-multiplexed detector readout systems. The FIR MKID can be readout at higher operating frequencies than conventional MKID designs, thus, increasing the detector array channel capacity. The present invention also produces low parasitic coupling to the adjacent detector channel to simplify the design and minimize interferences.

Figure 3:
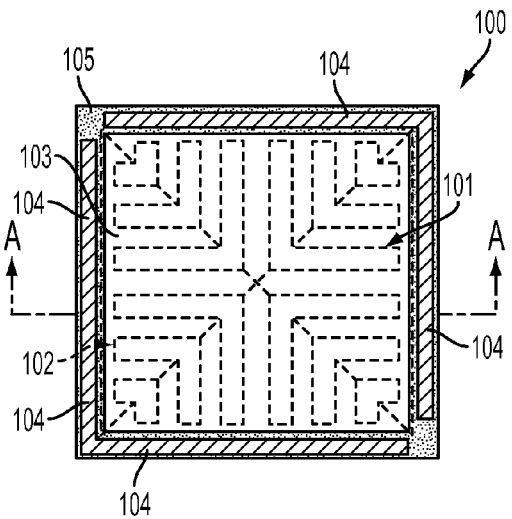
FIG. 3 is a plan view of a cross absorber patterned far-infrared microwave kinetic inductance detector (FIR MKID), according to one embodiment consistent with the present invention.
Figure 2:
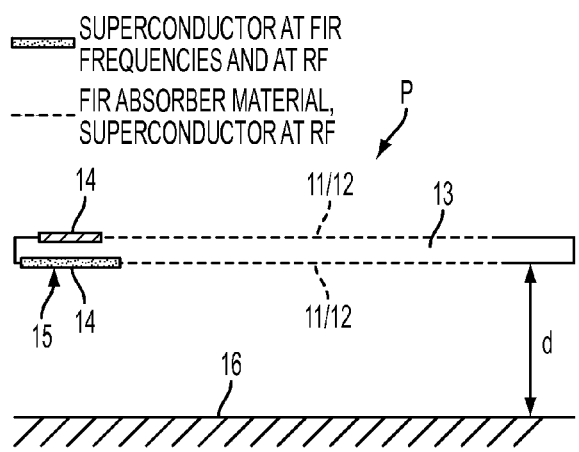
FIG. 2 is a cross-sectional view of the conventional microwave kinetic inductance detector (MKID) of FIG. 1.
Figure 4:
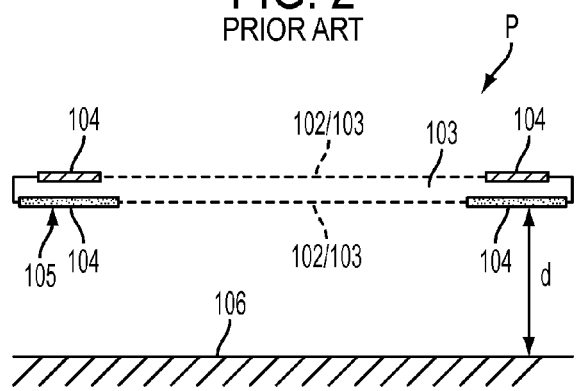
FIG. 4 is a cross-sectional view of the far-infrared microwave kinetic inductance detector (FIR MKID) of FIG. 3, according to one embodiment consistent with the present invention.

In one embodiment, the FIR MKID 100 of the present invention, to which power P is applied (see FIG. 3), is of a suitable size (i.e., 1.03 mm square), and includes a symmetric cross absorber resonator pattern 101 of infrared (IR) absorber 102, disposed on a thin (i.e., approximately 5 μm) membrane 103 of silicon (see FIG. 4 for a cross-sectional view along line "A").

In one embodiment, the microstrip electrical transmission line of the FIR MKID 100 includes low impedance (Z) conducting strips 104 along all four edges thereof, separated from a ground plane 105 by the silicon membrane 103 as a dielectric substrate layer.

The conducting strips 104 along the edges of the membrane 103 are a superconductor at FIR frequencies and at microwave frequency. The microwave component is formed from the microstrip electrical transmission line and includes the metal pattern 101 as an FIR absorber 102, which is a superconductor at RF. The microstrip line is at an FIR quarter-wave spacing or distance "d" from a conductor backshort 106.

At infrared (IR) frequencies, the MKID's superconducting metal pattern 101 behaves as an absorber. In one embodiment, the superconducting material used in the readout circuit (i.e., conducting strips 104 on the border of the pixel and microstrip lines running to the readout) is niobium. In one embodiment, the superconducting metal 102 used in the absorber/resonator structure (i.e., material 102 disposed on the dielectric membrane 103 which absorbs photons whose frequency is greater than the superconducting gap frequency, the photo absorption which breaks electron-electron or Cooper pairs and results in a shift in the resonant frequency), is a material 102 with a transition temperature below niobium, including one of aluminum, titanium nitride, or molybdenum nitride.

Figure 1:
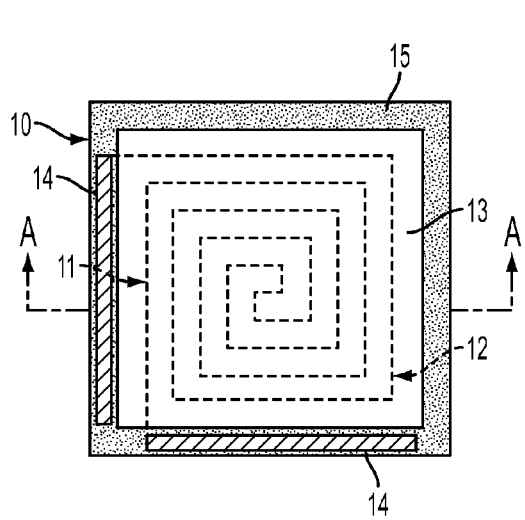
FIG. 1 is a plan view of a conventional spiral pattern microwave kinetic inductance detector (MKID).
Figure 5:
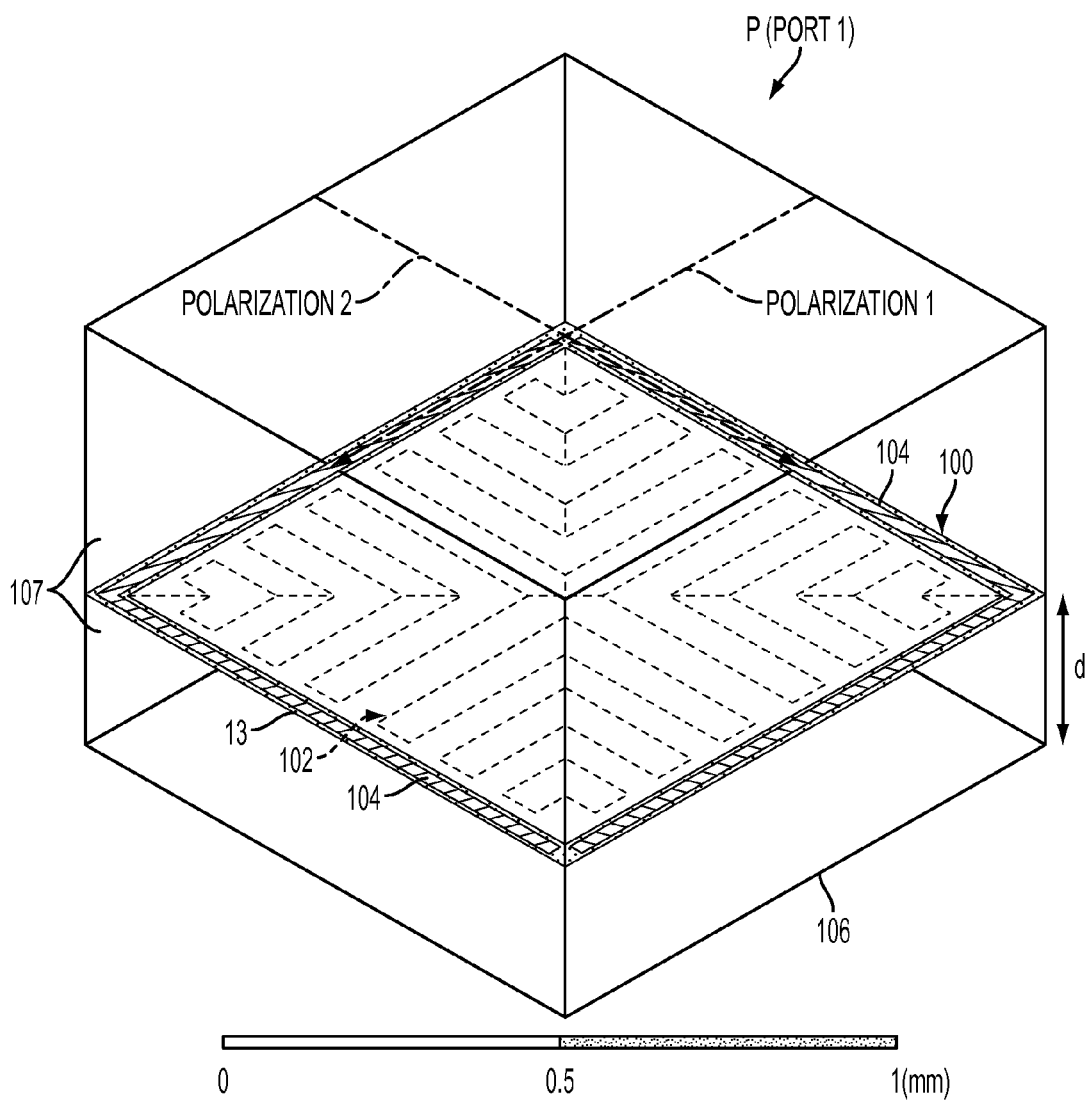
FIG. 5 is a perspective view of a unit cell of the FIR MKID with cross absorber metal pattern, according to one embodiment consistent with the present invention.
Figure 6A:
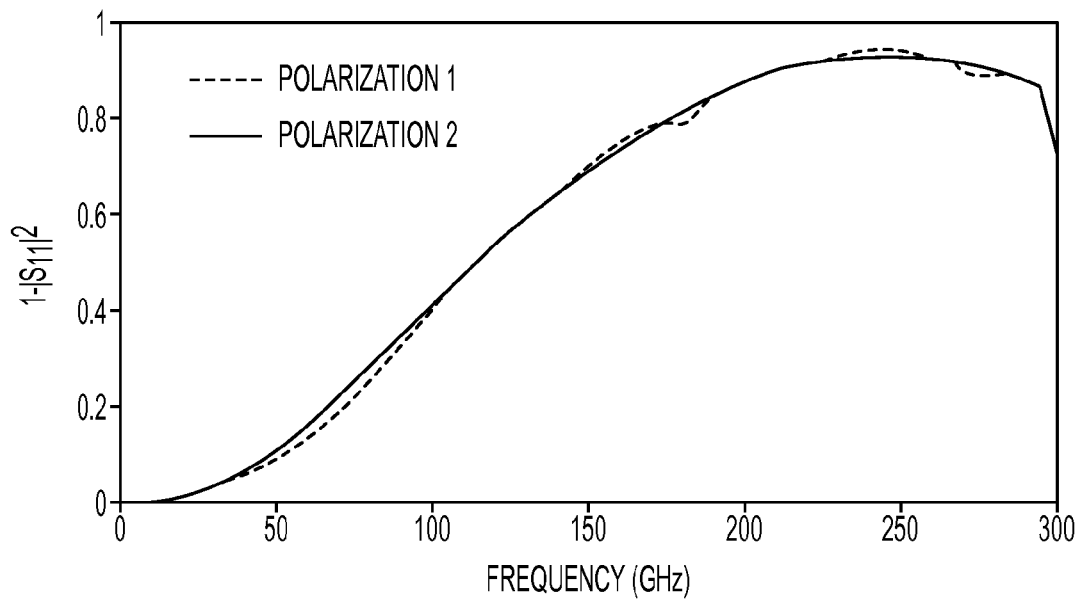
FIG. 6 (a) is a graph showing a simulated FIR power absorbed by the conventional spiral pattern MKID at two different polarizations.
Figure 6B:
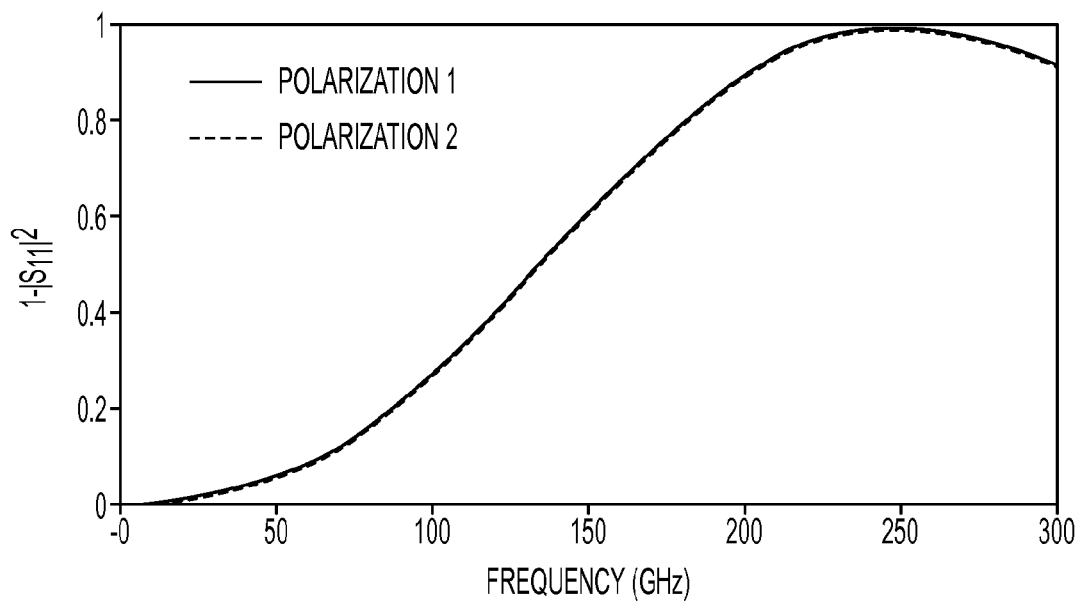

In one embodiment, the metal pattern 101 of the FIR MKID 100 for FIR absorption includes a symmetric cross bar pattern 101 on the membrane 103 which is used to provide identical power absorption for both horizontal and vertical polarization signals (see FIG. 5 for polarizations 1 and 2, for a unit cell of the FIR MKID 100 in a vacuum 107). The FIR power P absorbed by the metallic cross bar pattern 101 is different from that of the simulated spiral pattern 11 of the conventional MKID 10 (see FIG. 1) at the two different polarizations, as shown in FIGS. 6A-6B. In the graphs shown in FIGS. 6A-6B, the metallization sheet impedance is 40 Ohm/square, however, this may be changed appropriately, since the pixel's total filling fraction is adjusted to realize an appropriate impedance to maximize FIR coupling. Two absorber configurations are commonly used in practice: 1) $Z\_o(FIR)$ equal to the impedance of freespace (\eta=377 ohm/square) followed by a termination with quarter wave resonant backshort to achieve near unity coupling over a ~30% fractional waveband and 2) $Z\_o(FIR)=\eta/(sqrt(er(substrate)-1)=157$ ohms/square followed by a matched termination to approximate a frequency independent response in the present of the absorbers supporting substrate membrane (i.e., in this case the dielectric constant er(substrate) is 11.7 for silicon).

In considering the FIR coupling the several elements of the pixel geometry used in the array come into consideration in optimization of the coupling: 1) the fraction of the area presented by the absorber should dominated over that required by the readout, 2) in realizing $Z\_o$ (FIR) the spacing between lines should be <\lambda\_min/5 to minimize diffractive losses, and 3) the pixels in the array should be >\lambda\_max/2 to maximize coupling of the detector to the incident radiation. Here \lambda\_min and \lambda\_max are the shortest and longest wavelengths of interest in the FIR signal band." or similar.

Figure 7:
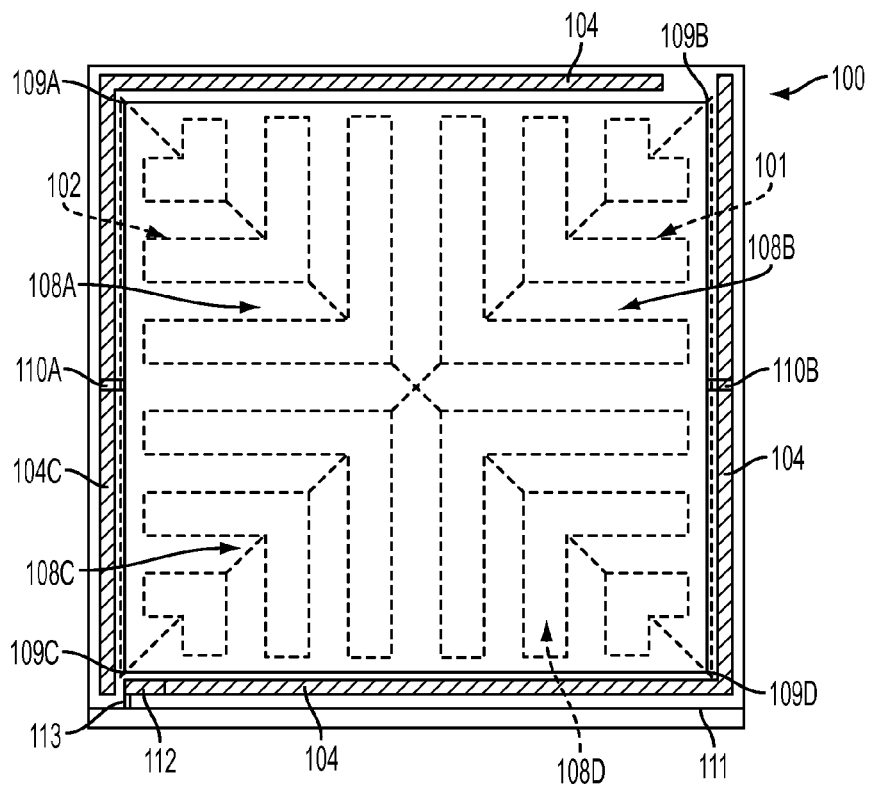
FIG. 7 is a plan view of an implementation of the cross pattern FIR MKID, with MKID resonator response for frequency-multiplex read-out in microwave frequency band, according to one embodiment consistent with the present invention.

In one embodiment, the cross bar metal pattern 101 of the absorber 102 is placed on both the top and bottom of the membrane 103 (see FIG. 4) to create a parallel plate coupled transmission line that acts as a half-wavelength resonator at readout frequencies. More specifically, in one embodiment as shown in FIG. 7, the parallel-plate transmission line on the membrane 103 is split into four sections 108A-D in a symmetric cross bar pattern 101. Although the metal pattern 101 is shown as symmetrical in FIG. 7, one of ordinary skill in the art would know that the arrangement may be of any design as long as it provides the current density required to keep the resonator frequency high. In the embodiment, the spacing between any two lines of the metal pattern 101 on the membrane 103 is set at most ⅕ of a wavelength at a shortest infra-red wavelength to minimize sheet reactance, provide an effective impedance match to that of free space, and minimize diffractive scattering from the absorber 102.

Figure 8:
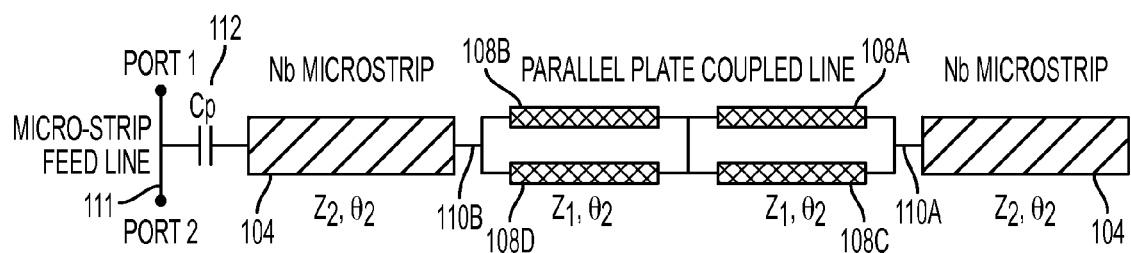
FIG. 8 is a schematic view of an equivalent transmission line model of the resonator and its readout interface at microwave frequency, according to one embodiment consistent with the present invention.

In one embodiment, at microwave frequency, the parallel-plate transmission line in the membrane 103 area is connected to the low impedance (Z) microstrip line 104 at the FIR MKID 100 edges, to form a stepped impedance resonator. More specifically, in one embodiment, two outputs (i.e., 109A and 109C, or 109B and 109D) from two sections (i.e., 108A and 108C, or 108B and 108D, respectively) of the parallel plate transmission line of the FIR MKID 100 combine the two sections (i.e., 108A and 108C, or 108B and 108D) at points 110A or 110B, respectively, of the microstrip line 104, to produce the stepped impedance resonator (see FIGS. 7-8). The impedance contrast in the parallel-coupled line ($Z_1$) of the four sections 108A-108D, and the conducting microstrip lines 104 ($Z_2$), forces most of the current to be on the membrane 103 (see FIG. 8). This produces high variation in kinetic impedance of the metal absorber 102 on the membrane 103 area, thus, increasing the FIR MKID 100 sensitivity. The resonator is coupled to a microstrip feed line 111 via a parallel-plate capacitor 112, at connection 113, on one side of the resonator (see FIG. 7). The capacitor 112 behaves as an impedance inverter. At resonance frequency, the resonator behaves as an electrical short at the feed line 111. As a result, signal transmission in the feed line 111 is reflected at resonance frequency.

Figure 9:
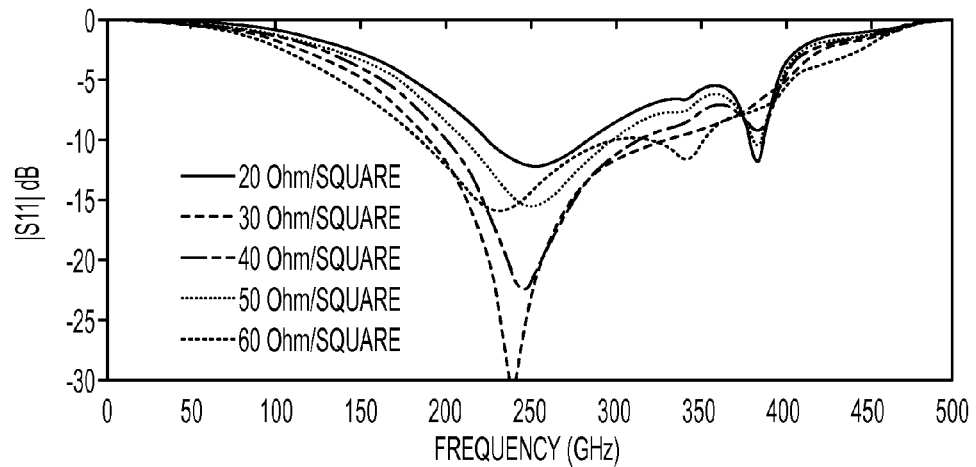
FIG. 9 is a graph showing a simulated return loss of the MKID using various FIR absorber sheet resistance values, according to one embodiment consistent with the present invention.

In one embodiment, the metal pattern 101 of the FIR MKID 100 is designed to have the effective area match with the characteristic impedance of that in free space, resulting in minimum return loss at the center of the operating frequency (see FIG. 9 which shows a simulated return loss of the MKID 100 using various FIR absorber sheet resistant values). This maximizes the power absorption in the metal pattern 101 causing the temperature of the metal absorber 102 to increase. At RF, this metal pattern 101 becomes a superconductor with the kinetic inductance changes dependent on the temperature of the metal 102. The detector 100 is operated at cryogenic temperatures below the superconducting transition temperature of the absorber metallization.

Figure 10:
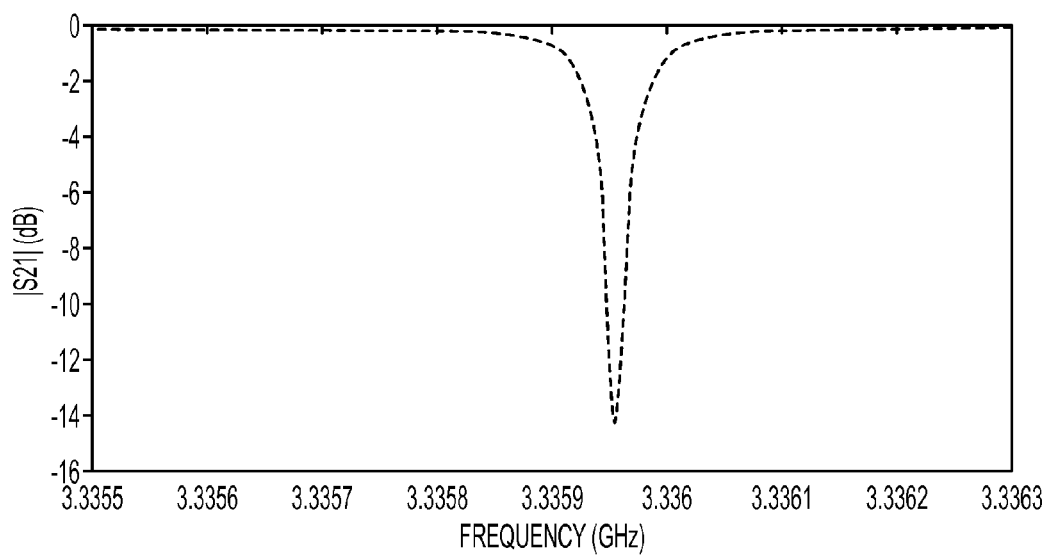
FIG. 10 is a graph showing a simulated FIR MKID response seen by a microstrip feed line, with the resonator having a coupling quality factor of 70,989, according to one embodiment consistent with the present invention.

In one embodiment, FIG. 10 shows a graph of a simulated FIR MKID 100 response seen by a microstrip feed line 111. The resonator has a quality factor of 70,989 in this simulation.

In one embodiment, when connected to a low impedance transmission line 104 at both ends 110A, 110B along the membrane 103 edges of the FIR MKID 100 (see FIG. 7), the FIR MKID 100 behaves as a half-wave resonator with its resonance frequency sensitive to IR incident power P (see FIG. 5). The impedance contrast between two types of transmission lines 104 causes the electrical current to be concentrated in the membrane 103 area. This keeps the majority of heat within the membrane 103 area, thus, increasing the sensitivity of the FIR MKID 100.

In one embodiment, the four sections 108A-108D of the transmission lines combined in parallel allow a long transmission line to exist in the membrane 103 area without increasing the electrical length of the resonator. Therefore, the FIR MKID 100 can produce a resonance frequency of at least 200% higher than any conventional half-wavelength FIR MKID.

In one embodiment, for an FIR MKID 100 made of aluminum superconductor material, operating at about 0.3 K, the total noise equivalent power is determined to be 1.1e-16 W/sqrt (Hz). The FIR MKID 100 is designed to receive IR power of 10 pW at the frequency ranges between 230 and 270 GHz.

In one embodiment, the FIR MKID 100 requires a cryogenic cooling system with two RF interconnections on the FIR MKID 100. An RF signal generator is used to inject RF power into the RF feed line 111. In one embodiment, the silicon substrate 103 (at cryogenic temperatures) is virtually invisible to the incident far-IR (FIR) radiation, and absorption takes place in the resonator metallization (i.e., metal pattern 101), and in effect, the resonator plays the role of absorber 102 and a means of readout.

In one embodiment, a vector network analyzer or an in-phase/quadrature-phase mixer and amplifier are required to readout the signals. Since the RIF MKID 100 contains the membrane 103, it requires careful handling. Due to its operation in a vacuum environment, pressure in the FIR MKID 100 system must be carefully monitored to assure slow increase or decrease in pressure to prevent any membrane 103 damage. In one embodiment, the FIR MKID 100 is kept in a nitrogen box for storage and to prevent exposure to normal air to reduce the chance of oxidation of the detector material 102.

In one embodiment, the superconductor material 102 can be changed to further increase the detector channel capacity and sensitivity of the FIR MKID 100.

Figure 11:
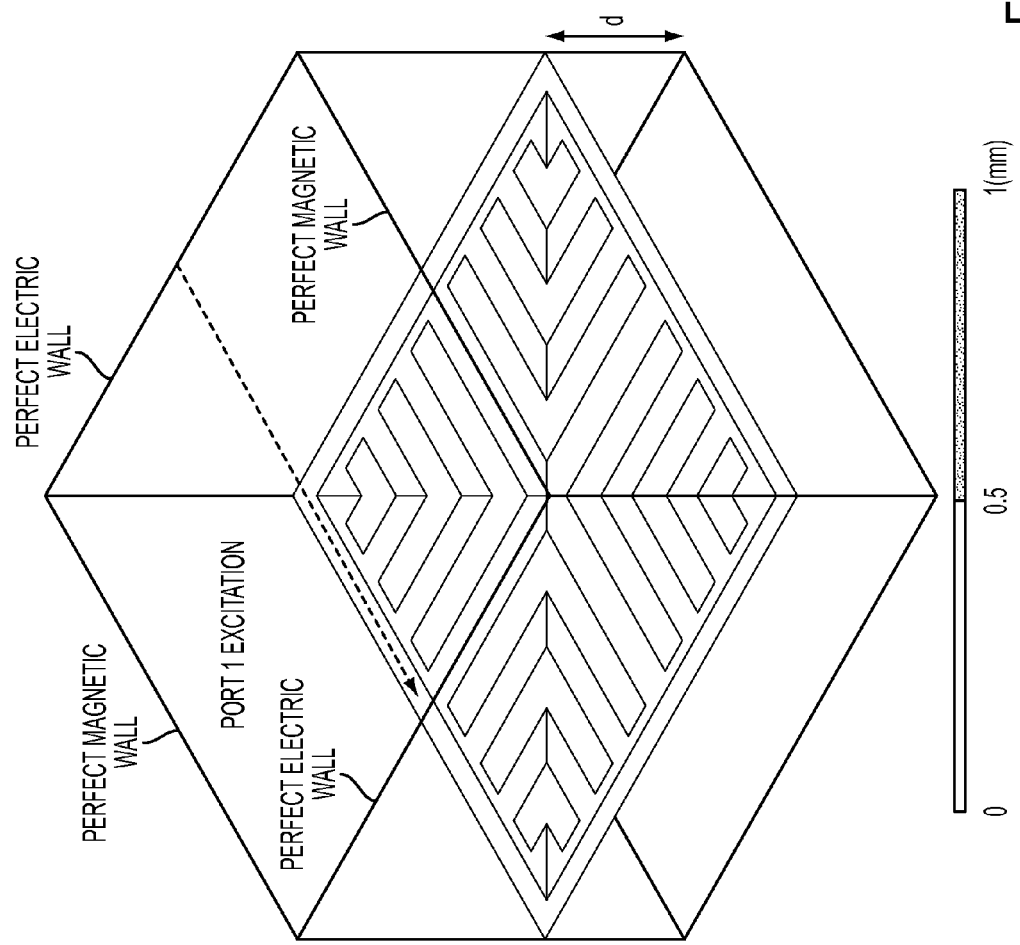
FIG. 11 is a perspective view of a unit cell with electromagnetic simulation setup of the MKID in an infinite array configuration to simulate the power absorbed by the detector, according to one embodiment consistent with the present invention.

In one embodiment, the FIR MKID 100 has been modeled in an electromagnetic simulation software (see FIG. 11 showing an electromagnetic setup of the FIR MKID 100 in an infinite array configuration to simulate the power P absorbed by the detector). In one embodiment, the resonance frequency of the resonator of the present invention matched with what was obtained from the electromagnetic simulation within a few percent.

Thus, in summary, the FIR MKID 100 of the present invention includes features of a symmetric cross-shaped, meandered, transmission line pattern 101 that allows the IR signal to be coupled to the metal absorber 102 equally for both horizontal and vertical polarization. This pattern 101 also increases the resonance frequency of the resonator, thus, increasing the channel capacity of the FIR MKID 100 when used in a large array configuration. A parallel coupled transmission line has strong field confinement between two conductors 104. As a result, the resonator has much weaker coupling field to the adjacent pixels. This reduces the uncertainty in resonance frequency calculation and frequency allocation of each detector.

Further, the FIR MKID 100 of the present invention allows higher absorber 102 filling fraction (at the readout wavelength without blocking the far-IR signal), minimal diffractive effects (a larger single-mode operating bandwidth), higher quantum efficiency (by concentration of the resonator fields in the center of the pixel), while allowing flexibility in tailoring the microwave readout frequency.

Still further, the FIR MKID 100 of the present invention allows incident power to be absorbed equally for both horizontal and vertical polarization. In addition, the new absorber metallization pattern 101 allows power to be more evenly distributed across the detector area than the conventional detectors, thus, increasing the detector sensitivity. Furthermore, the new pattern 101 allows the output of the detector to be frequency multiplexed at more than twice the frequency of the conventional MKID 10 design. Finally, its resonator transmission line design minimizes parasitic coupling among the adjacent resonator channels. The present invention reduces the complexity in resonator calculations and allows more detectors to be frequency multiplexed in a limited RF readout bandwidth with significantly smaller crosstalk. Ultimately the present invention can reduce energy expenditures and increase data acquisition in space applications.

In one embodiment, the FIR MKID 100 of the present invention is used in space applications to detect very low power far infra-red (FIR) frequency signals that have both horizontal and vertical polarizations, and can potentially be installed in low background optical systems (e.g., ground, balloon, and spaceborne telescopes). In one application of the present invention, the FIR MKID 100 is used in millimeter to sub-millimeter radiation detection (100-700 GHz range). The array technology of the present invention provides a large number of background limited detectors whose RF readout approach reduces the heat load and cooling capacity.

Additional applications of the present invention include space-borne and ground-based imaging, precision metrology, and non-destructive testing (e.g., identification of imperfections in metalloid and non-metal materials). The present invention may also be utilized in a variety of industrial applications, as well as for homeland security screening applications. The FIR MKID 100 of the present invention may be fixed in nature due to the cooling requirements for the technology (i.e., operational at <4 K with the materials consistent with one embodiment of the present invention).

Further, the present invention includes advantages over existing far infra-red (FIR) sensing mechanisms for space and satellite operations. Specific advantages over existing systems include: 1) decreased energy requirements for operation; 2) the ability to operate at very low temperatures (near absolute zero) and, 3) the ability to sense IR signals in the Far IR spectrum.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention, Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

What is claimed is:

1. A far-infrared microwave kinetic inductance detector comprising:
   a membrane having an absorber disposed thereon; and
   a microstrip including a plurality of conductor microstrip lines disposed along all edges of said membrane, and separated from a ground plane by said membrane;
   wherein said absorber is disposed in a pattern, including a symmetric cross bar pattern, on said membrane, and also wherein said pattern is made from a metallic material formed from a superconducting material with a transition temperature below niobium, including one of aluminum, titanium nitride, or molybdenum nitride, and said conducting microstrip lines are made from niobium and said pattern is disposed on both a top and a bottom of said membrane, and creates a parallel-plate coupled transmission line on said membrane that acts as a half-wavelength resonator at readout frequencies.

2. The detector of claim 1, wherein said parallel-plate coupled transmission line and said conductor microstrip lines form a stepped impedance resonator.

3. The detector of claim 2, wherein said pattern on said membrane is divided into four sections.

4. The detector of claim 3, wherein two outputs of two of said four sections combine a respective two of said four sections at two points of said conductor microstrip lines to produce said stepped impedance resonator.

5. The detector of claim 4, wherein said stepped impedance resonator is coupled to a microstrip feed line via a parallel-plate capacitor which performs as an impedance inverter.

6. The detector of claim 5, wherein the detector is utilized at cryogenic temperatures below said transition temperature of absorber metallization of said superconducting material.

7. The detector of claim 5, wherein said pattern increases a resonance frequency of said stepped impedance resonator, to increase a channel capacity of the detector when used in a large array configuration.

8. The detector of claim 7, wherein said pattern allows power to be more evenly distributed across a physical area of the detector to increase detector sensitivity.

9. The detector of claim 8, wherein said parallel-plate coupled transmission line minimizes parasitic coupling among adjacent resonator channels.

10. The detector of claim 9, wherein the detector is frequency multiplexed in a limited microwave frequency readout bandwidth with reduced crosstalk.

11. The detector of claim 1, wherein said conductor microstrip lines are disposed at a top and at a bottom of said membrane, and said microstrip lines at said bottom of said membrane are at a far infra-red quarter-wave spacing from a conductor backshort.

12. The detector of claim 11, wherein a spacing between any two lines of said pattern on said membrane is set at most $1/5$ of a wavelength at a shortest infra-red wavelength to minimize sheet reactance, provide an effective impedance match to that of free space, and minimize diffractive scattering from said metallic material as said absorber.

13. The detector of claim 1, wherein said pattern provides identical power absorption for both horizontal and vertical polarization signals.

14. The detector of claim 1, wherein the detector is used in space applications to detect very low power far infra-red frequency signals that have both horizontal and vertical polarizations.

15. The detector of claim 14, wherein the detector is installed in low background optical systems.

16. The detector of claim 14, wherein the detector is used in millimeter to sub-millimeter radiation detection in a 30-3000 GHz range.

* * * * *